United States Patent [19]
Moon et al.

[11] Patent Number: 6,078,536
[45] Date of Patent: Jun. 20, 2000

[54] PACKET TYPE INTEGRATED CIRCUIT MEMORY DEVICES HAVING PINS ASSIGNED DIRECT TEST MODE AND ASSOCIATED METHODS

[75] Inventors: Byung-sick Moon; Kye-hyun Kyung, both of Kyungki-do; Sung-joo Lee, Seoul, all of Rep. of Korea

[73] Assignee: Samsung Electronics Co., Ltd., Rep. of Korea

[21] Appl. No.: 09/207,534

[22] Filed: Dec. 8, 1998

[30] Foreign Application Priority Data

Dec. 8, 1997 [KR] Rep. of Korea ................. 97-66748

[51] Int. Cl.[7] ................................................. G11C 7/00
[52] U.S. Cl. ................................. 365/201; 365/230.06
[58] Field of Search ............................... 365/230.06, 201, 365/63; 326/30; 327/292

[56] References Cited

U.S. PATENT DOCUMENTS

| | | | |
|---|---|---|---|
| 4,205,373 | 5/1980 | Shah et al. ........................... | 364/200 |
| 5,473,575 | 12/1995 | Farmwald et al. ................. | 365/230.06 |
| 5,578,940 | 11/1996 | Dillon et al. ........................ | 326/30 |
| 5,606,717 | 2/1997 | Farmwald et al. ................. | 395/856 |
| 5,663,661 | 9/1997 | Dillon et al. ........................ | 326/30 |
| 5,799,209 | 8/1998 | Chatter ................................ | 395/876 |

*Primary Examiner*—Vu A. Le
*Attorney, Agent, or Firm*—Myers Bigel Sibley & Sajovec

[57] ABSTRACT

An integrated circuit memory device and method including a direct mode assigns internal data and address signals to separate pins. In particular, a plurality of first pins is assigned to the plurality of internal data signals that provide the data to the memory array in direct test mode. A plurality of second pins is assigned to the plurality of internal address signals that provide the address to the memory array in direct test mode, wherein none of the pins included in first plurality of pins are included in the second plurality of pins.

15 Claims, 8 Drawing Sheets

FIG. 1 (PRIOR ART)

| NORMAL MODE PIN DESIGNATIONS | DIRECT TEST MODE PIN DESIGNATIONS | INTERNAL SIGNALS |
|---|---|---|
| DQA<5:0> | TestA<5:0> | RADR<5:0>,CADR<5:0>,RWDA<5:0> |
| DQA<7:6> | TestA<7:6> | RADR<7:6>,RWDA<7:6> |
| DQA<8> | TestA<16> | RWDA<8> |
| DQB<1:0> | TestA<9:8> | RADR<9:8>,RWDB<1:0> |
| DQB<5:2> | TestA<13:10> | RADR<13:10>,PBSEL<3:0>,RWDB<5:2> |
| DQB<7:6> | TestA<15:14> | ExAddr<1:0>,RWDB<7:6> |
| DQB<8> | TestA<17> | RWDB<8> |
| RQ<0> | TestRASb | PRECH,BSENSE |
| RQ<1> | TestCASb | COLCYC,COLLAT |
| RQ<2> | TestWrite | WRITE |
| RQ<7:3> | TestCtrl<4:0> | TestCtrl<4:0> |
| CFM/CFMN | TestClkW | |
| CTM/CTMN | TestClkR | |

| NORMAL MODE PIN DESIGNATIONS | DIRECT TEST MODE PIN DESIGNATIONS | INTERNAL SIGNALS |
|---|---|---|
| DQA<8:0> | TestDQA<8:0> | RWDA<8:0> |
| DQB<8:0> | TestDQB<8:0> | RWDB<8:0> |
| RQ<7:0> | TestA<7:0> | RADR<7:0>,CADR<5:0> |
| CLOUT | TestA<8> | RADR<8>,CBSEL<0>,PBSEL<0> |
| SIN | TestA<9> | RADR<9>,CBSEL<1>,PBSEL<1> |
| SOUT | TestA<10> | RADR<10>,CBSEL<2>,PBSEL<2> |
| CTM | TestA<11> | RADR<11>,CBSEL<3>,PBSEL<3> |
| CTMN | TestWRITE | WRITE |
| CFM | TestRASB | BSENSE,PRECH |
| CFMN | TestCASB | COLLAT,COLCYC |

| NORMAL MODE PIN DESIGNATIONS | DIRECT TEST MODE PIN DESIGNATIONS | INTERNAL SIGNAL |
|---|---|---|
| DQA<6:0:2> | TestDQA<3:0> | RWDA<7:0> |
| DQB<6:0:2> | TestDQB<3:0> | RWDB<7:0> |
| DQA<7:1:2> | TestA<11:8> | RADR<11:8>,CBSEL<3:0>,PBSEL<3:0> |
| DQB<7:3:2> | | |
| RQ<7:0> | TestA<7:0> | RADR<7:0>,CADR<5:0> |
| DQB<1> | TestWRITE | WRITE |
| CFM/CFMN | TestRASB | BSENSE,PRECH |
| CTM/CTMN | TestCASB | COLLAT,COLCYC |

PACKET TYPE INTEGRATED CIRCUIT MEMORY DEVICES HAVING PINS ASSIGNED DIRECT TEST MODE AND ASSOCIATED METHODS

FIELD OF THE INVENTION

The present invention relates to integrated circuit memory devices in general, and more particularly to packet type integrated circuit memory devices that use a direct test mode.

BACKGROUND OF THE INVENTION

Electronic systems that use a high level of data bandwidth, such as in multimedia applications, may need memory devices that provide the necessary rate of data transfer and other advantages. One technology that may provide the necessary bandwidth is the Rambus technology marketed by Rambus, Inc. of Mountain View, Calif. The Rambus technology is described in U.S. Pat. Nos. 5,473,575 to Farmwald et al., 5,578,940 to Dillion et al., 5,606,717 to Farmwald et al. and 5,663,661 to Dillion et al. A device embodying the Rambus technology is an example of a packet type integrated circuit memory device, because each integrated circuit receives data and addresses in packet units in a normal mode of operation. The packet is received by the Rambus device which generates internal control signals, internal data signals, and internal address signals to carry out the corresponding operation of the packet. For example, the packet may include data, address, and control signals for a write operation.

As the demand for the above described systems increases, so may the demand for Rambus devices. The time for testing of Rambus integrated circuit memory devices may therefore become more important. Testing of the Rambus integrated circuit memory device may be performed using a direct test mode wherein a portion of the control circuitry of the Rambus integrated circuit memory device is bypassed so that the memory may be controlled and accessed directly. The pins of the Rambus integrated circuit memory device may be reassigned to facilitate the testing of the Rambus integrated circuit memory device in the direct test mode.

Figure 1:
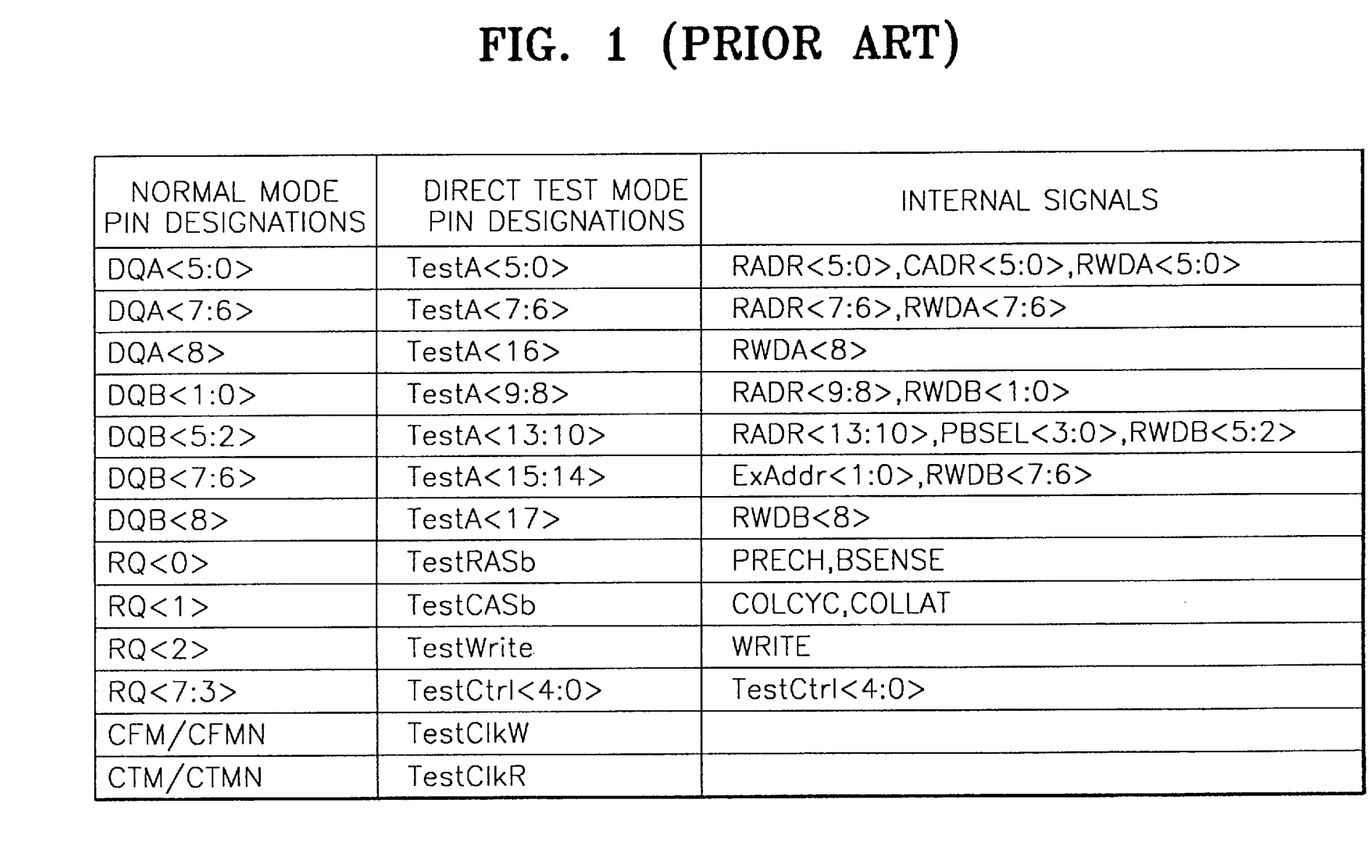
FIG. 1 is a table that illustrates pin assignments for an integrated circuit memory device in normal mode and in direct test mode according to the prior art.

FIG. 1 is a table illustrating pin assignments for a Rambus integrated circuit memory device operating in normal mode and in direct test mode. For example, according to FIG. 1, pins DQA<5:0> are used to write/read data to/from the Rambus integrated circuit memory device in normal mode. In direct test mode the same pins are designated as TestA<5:0> and provide the data for writing and reading data to/from the Rambus integrated circuit memory device and a portion of the row address (RADR<5:0>) and a portion of the column addresses (CADR<5:0>) in direct test mode (i.e., the core interface signals shown in FIG. 1). Other pin designations in direct test mode may be as shown in FIG. 1.

Figure 2:
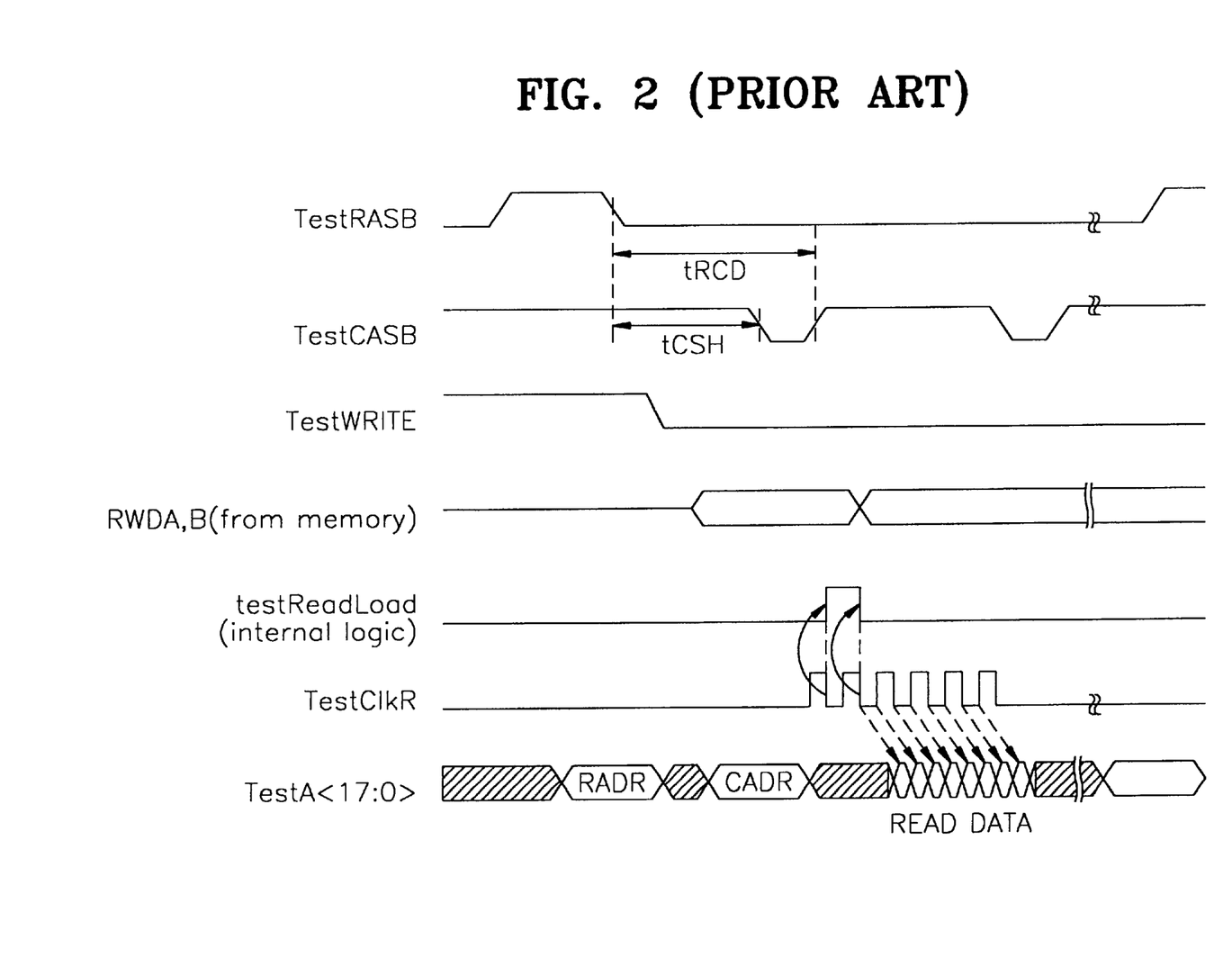
FIG. 2 is a timing diagram that illustrates direct test mode read operations according to the prior art.

FIG. 2 is a timing diagram that illustrates direct test mode read operations of a Rambus device according to the prior art. According to FIG. 2, when the signal applied to the TestRASB pin transitions from high to low the row address applied to the test address pins selects a word line in the memory array and a bitline is sensed. When the signal applied to be TestCASB pins transitions from high to low the column address and the column bank address CBSEL are latched to the memory array. When the signal applied to the test column addressed strobe pin TestCASB returns to the high state the data read from the memory array as RWDA and RWDB. RWDA and RWDB are output from the Rambus device synchronous with the TestClkR signal via pins TestA<17:0>. When the precharge bank select PBSEL applied to the pins TestA<17:0>, and the TestRASB signal returns to a high level the activated bank is returned to the precharged state.

Figure 3:
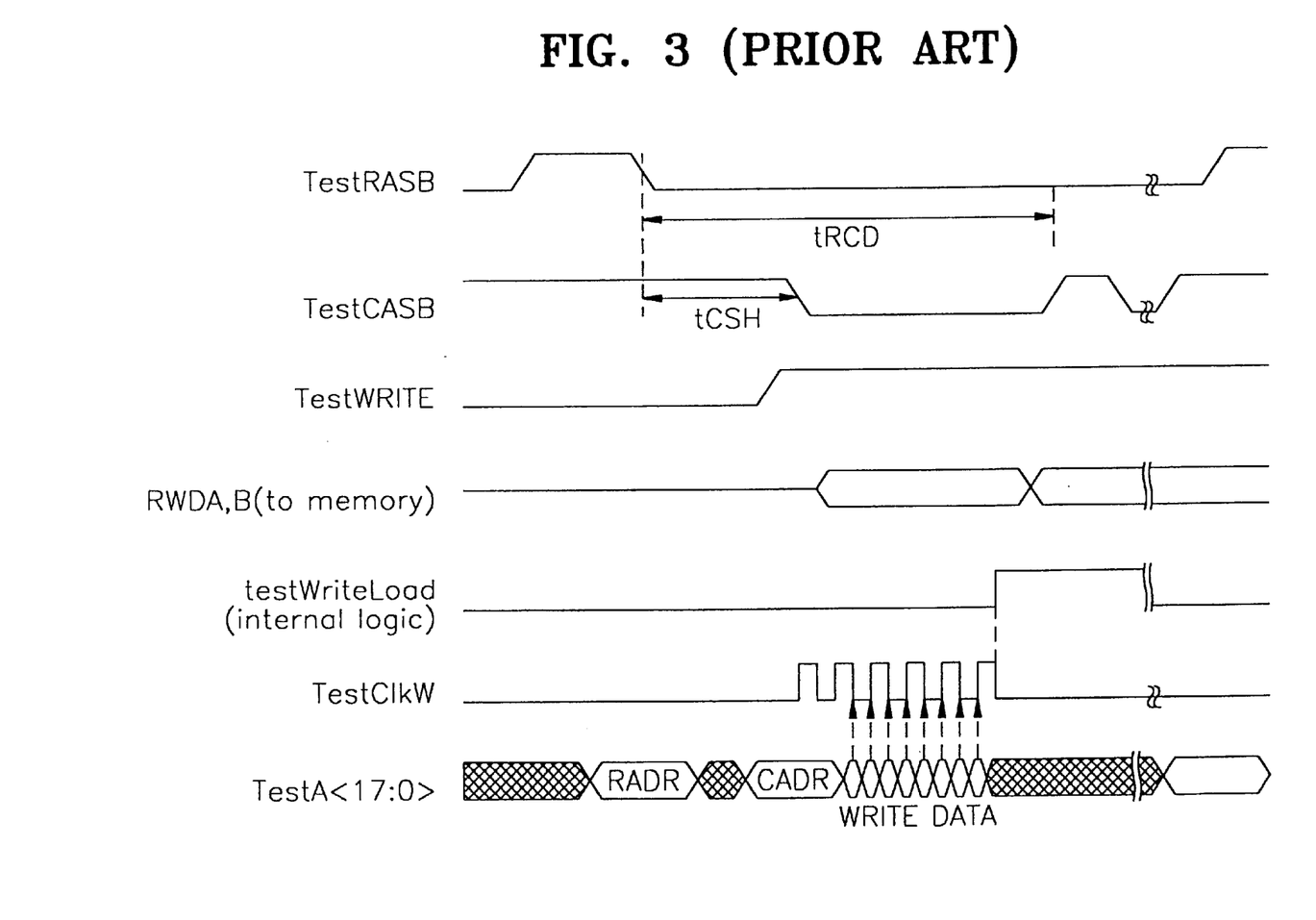
FIG. 3 is a timing diagram that illustrates direct test mode write operations according to the prior art.

FIG. 3 is a timing diagram that illustrates direct test mode write operations of a Rambus device according to the prior art. According to FIG. 3, when the signal applied to the TestRASB pin transitions from high to low the row address applied to test address pins TestA<17:0> is latched to the memory array and a word line of the memory array is selected. When the signal applied to the TestCASB pin transitions from high to low and the column bank address CBSEL is asserted, the data input to the test address pins TestA<17:0> is synchronized with the test write clock TestClkW and the data RWDA and RWDB is written to the memory array address corresponding to the row address and the column address. When the TestRASB signal returns to the high state and the precharge bank address PBSEL is applied to the test address pins TestA<17:0> the activated bank is returned to the precharge state.

Unfortunately, test systems designed to test other types of integrated circuit memory devices may not be able to test the Rambus technology. In view of the above, there is a need for improvements in the testing of Rambus technology.

SUMMARY OF THE INVENTION

It is, therefore, an object of the present invention to provide improvements in packet type integrated circuit memory devices.

It is another object of the present invention to improve the testing of packet type integrated circuit memory devices having a direct test mode.

It is a further object of the present invention to allow conventional integrated circuit memory test systems to test packet type integrated circuit memory devices in direct test mode.

These and other objects are provided by packet type integrated circuit memory devices and methods wherein the internal data and address signals are provided to the memory array in the packet type integrated circuit memory device through separate pins during testing, thereby allowing a reduction in testing time and allowing the use of conventional testers to test the packet type integrated circuit memory device. In particular, a plurality of first pins is assigned to a plurality of internal data signals in the packet type integrated circuit memory device. The internal data signals provide the data information to the memory array in direct test mode. A plurality of second pins is assigned to the plurality of internal address signals that provide the address information to the memory array in direct test mode, wherein none of the pins included in the plurality of first pins are included in the plurality of second pins. In contrast, conventional integrated circuit memory devices may use some of the same pins to provide data and address to the memory array. Multiplexing the address and data may increase the timing of the read and write operations that test the packet type integrated circuit memory devices and may reduce the utility of conventional memory testers as applied to the packet type integrated circuit memory devices described herein.

In another aspect of the present invention, a plurality of third pins is assigned to a plurality of internal control signals that provide the control information, wherein at least one of the plurality of second pins is included in the plurality of third pins.

In still another aspect of the present invention, pairs of the internal data signals are assigned to a pin in the plurality of first pins on the packet type integrated circuit memory device. Consequently, full data words may be written to the memory array in direct test mode using half data words by duplicating the bits in the half word. Similarly, half data words are read from the memory and compared to determine if an error has occurred in the memory array. In particular, a plurality of pins on the packet type integrated circuit memory device receive the data from the direct test mode write operation to provide received write data. A plurality of buffers transmit the received data to provide buffered write data in response to the direct test mode write operation. A plurality of switches transfer the buffered write data to provide switched write data. A plurality of comparators duplicate the switched write data to provide a duplicated data bit pair including two data bits. A memory array stores the duplicated data bit pair in response to the direct test mode write operation.

The memory array retrieves the stored duplicated data bit pair to provide a retrieved duplicated data bit pair to the plurality of comparators in response to the direct test mode read operation. The plurality of comparators provide compared read data to the plurality of switches based on a difference in two data bits in the retrieved duplicated data bit pair. The plurality of switches transfer the compared read data to the plurality of data buffers. The plurality of buffers transmit buffered read data to the plurality of pins based on the transferred compared read data. The plurality of pins provide read data based on the buffered read data in response to the direct test mode read operation.

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that the term "assigning" used herein includes both the designing process of designating pins of a packet type integrated circuit memory device to carry internal signals, and the manufacturing process of coupling pins of a packet type integrated circuit memory device to internal signals.

Figure 4:
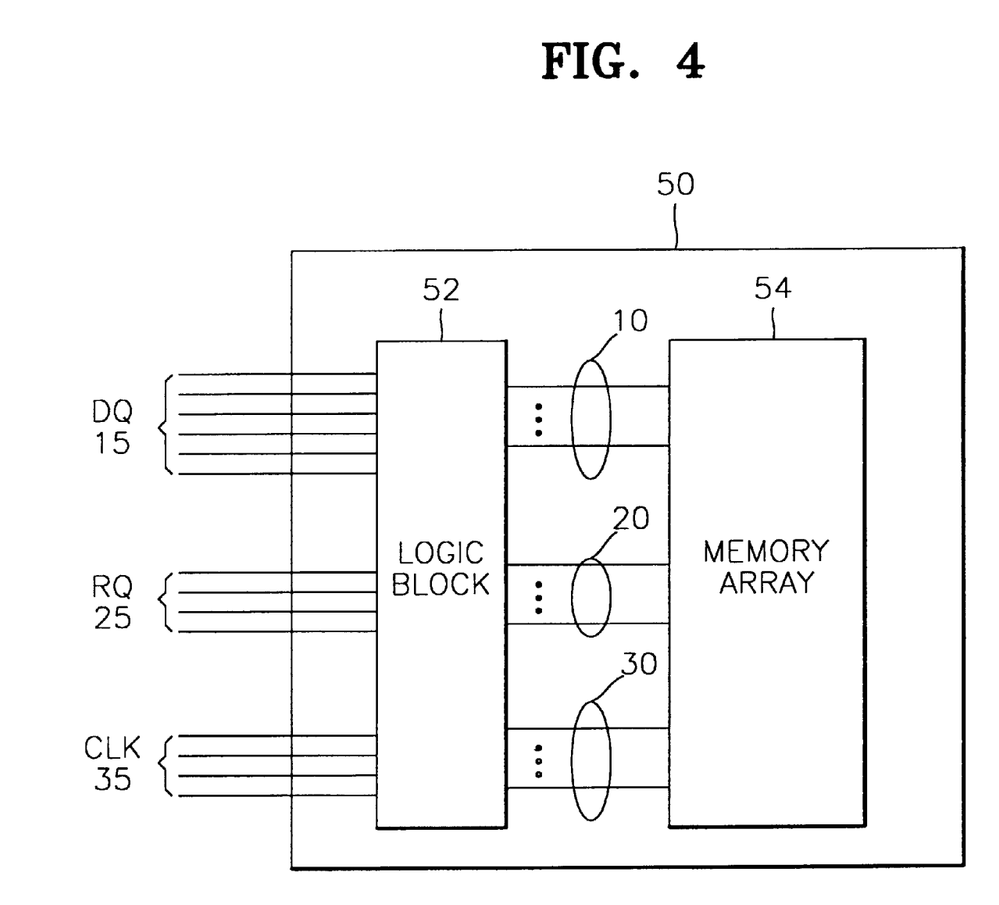
FIG. 4 is a block diagram of a packet type integrated circuit memory device according to the present invention.

FIG. 4 is a block diagram of a packet type integrated circuit memory device according to the present invention. The packet type integrated circuit memory device 50 includes pins DQ 15 which provide data and pins RQ 25 which provide addresses and pins CLK 35 which provide clocks. The data, address, and clocks are provided to a logic block 52. The logic block 52 receives the data, address, and clocks and generates the signals for controlling the memory alloy 54, includes data 10, address 20 and control signals 30. The packet type integrated circuit memory device 50 writes/retrieves data to/from the memory array 81 by applying the address and data to the respective address and data pins with the proper control signals.

The operations that control the packet type integrated circuit memory device 50 are designated as write operations and read operations. The read and write operations are performed using packets. For example, a write operation in normal mode is performed using a normal mode packet. Operations are performed in the direct test mode using direct test mode packets. For example a write operation in direct test mode is performed using a direct test mode write packet.

Figure 5:
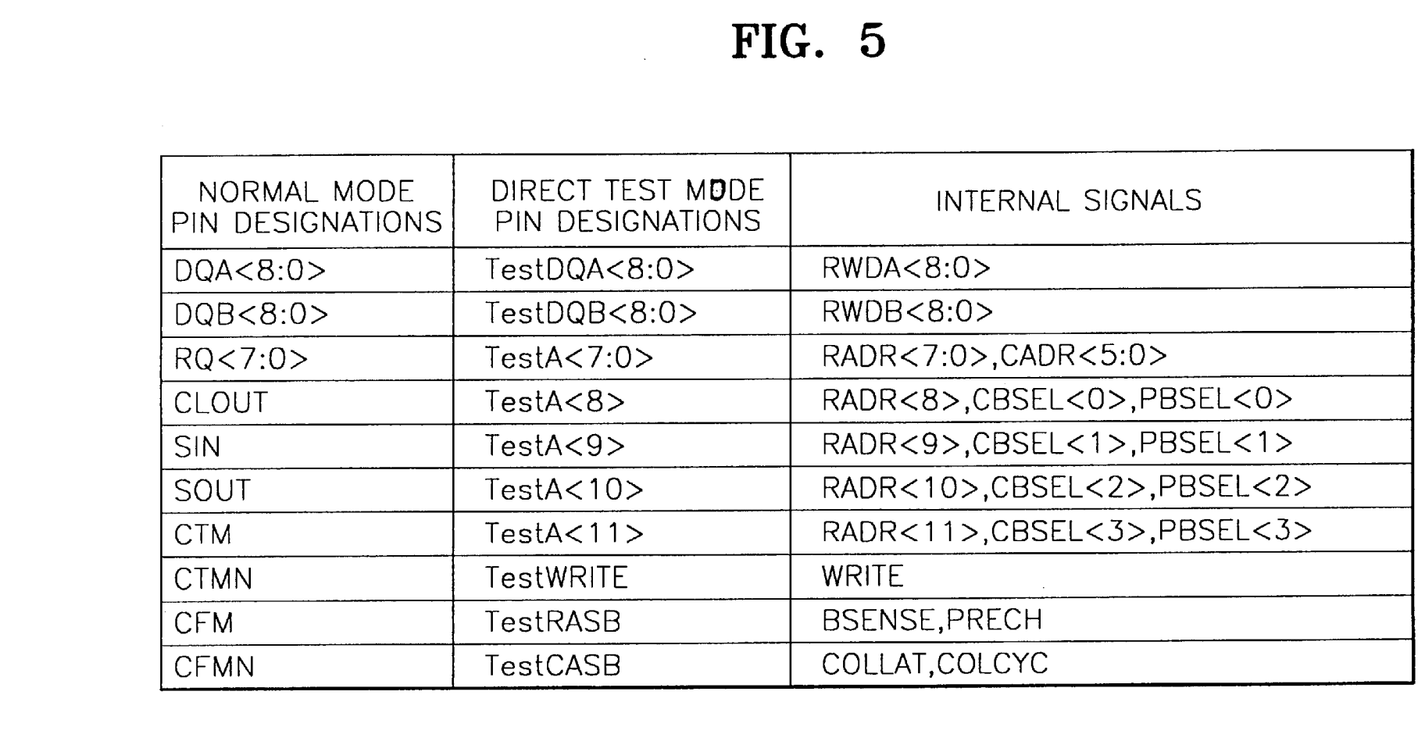
FIG. 5 is a table that illustrates a first embodiment of pin assignments and methods for a packet type integrated circuit memory device operation in direct test mode according to the present invention.

FIG. 5 is a table that illustrates a first embodiment of pin assignments and methods for a packet type integrated circuit memory device having a direct test mode according to the present invention. According to FIG. 5, the internal signals that provide data and addresses to the memory array in normal mode are provided to the packet type integrated circuit memory device via separate pins in direct test mode. In particular, a plurality of data pins TestDQA<8:0> and TestDQB<8:0> are assigned to corresponding internal signals RWDA<8:0> and RWDB<8:0> respectively. Address and control pins TestA<11:0> provide the addresses and control signals to the memory array. In contrast, conventional packet type integrated circuit memory devices having a direct test mode may assign the data and addresses to the same pins and therefore may need to be time multiplexed to the memory array.

Request pins RQ<7:0> in normal mode are designated as TestA<7:0> in direct mode to provide row address bits RADR<7:0> and column address bits CADR<5:0> at the respective times in direct test mode. The CLOUT, SIN, SOUT, and CTM pins in normal mode are designated as TestA<8:11> pins respectively to provide RADR<8:11>, CBSEL<0:3>, and PBSEL<0:3> internal signals at the proper times in the direct test mode. The CFM and CFMN pins in normal mode are designated as TestRASB and TestCASB respectively to provide BSENSE and PRECH internal signals and COLLAT and COLCYC internal signals at the proper times. The CTMN pin in normal mode is designated as a TestWrite internal signal to provide a WRITE signal in the direct test mode.

Figure 6:
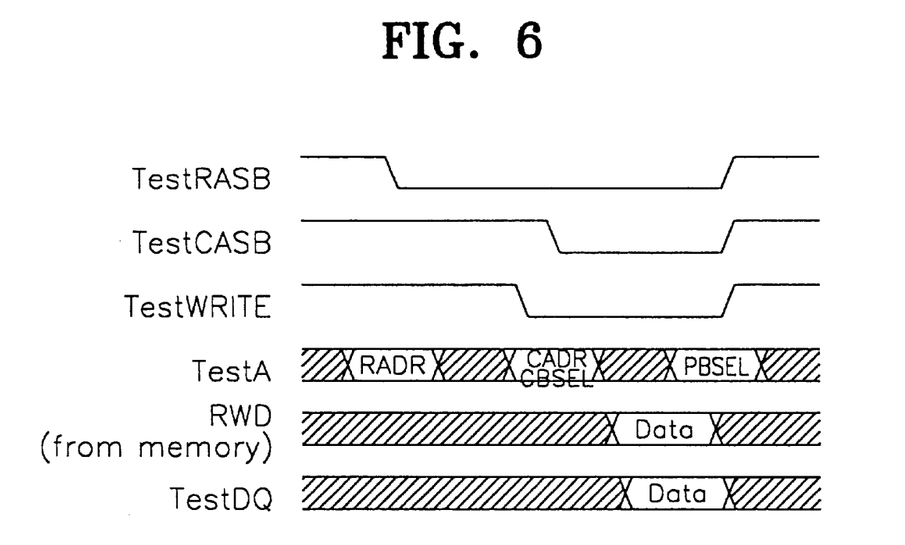
FIG. 6 is a timing diagram that illustrates direct test mode read operations according to the pin assignments of FIG. 5.

FIG. 6 is a timing diagram that illustrates direct test mode read operations according to the pin assignments of FIG. 5. According to FIG. 6, when the signal applied to the TestRASB pin transitions from high to low the row address provided to pins TestA<11:0> selects a word line of the memory array. When the signal applied to the TestCASB pin transitions from high to low the column address provided to pins TestA<11:0> and the column bank select signal applied to the CBSEL pin selects a column in the memory array. The corresponding data read from the memory array, RWDA<8:0> and RWDB<8:0> are provided to the TestDQA <8:0> and TestDQB <8:0> pins respectively. When the precharge bank select signal is applied to the PBSEL pin and the signal applied to the TestRASB pin transitions from a low to a high, the selected bank of the memory array is restored to the precharge state.

Figure 7:
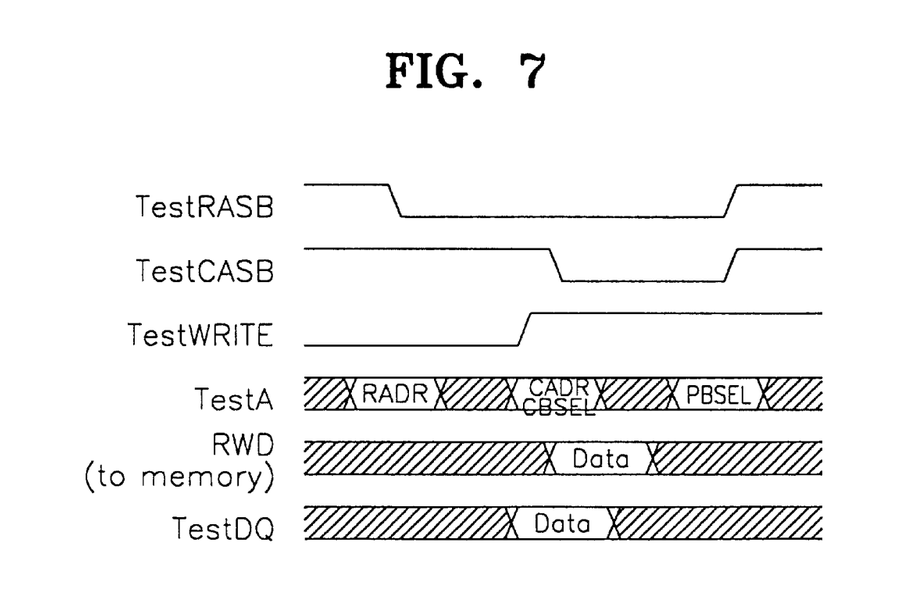
FIG. 7 is a timing diagram that illustrates direct test mode write operations according to the pin assignments of FIG. 5.

FIG. 7 is a timing diagram that illustrates direct test mode write operations according to the pin assignments of FIG. 5. According to FIG. 7, when the signal applied to the TestRASB pin transitions from a high to a low the row address applied to the TestA <11:0> pins a word is selected in the memory array. When the signal applied to the TestCASB pin transitions from a high to a low the column address applied to the TestA<11:0> pins and the column bank select signal applied to the CBSEL pin, the data applied to the TestDQA <8:0> pins and TestDQB <8:0> pins is provided to the internal signals RWDA <8:0> and RWDA <8:0> respectively and stored in the memory array in response to the TestWrite signal.

Figure 8:
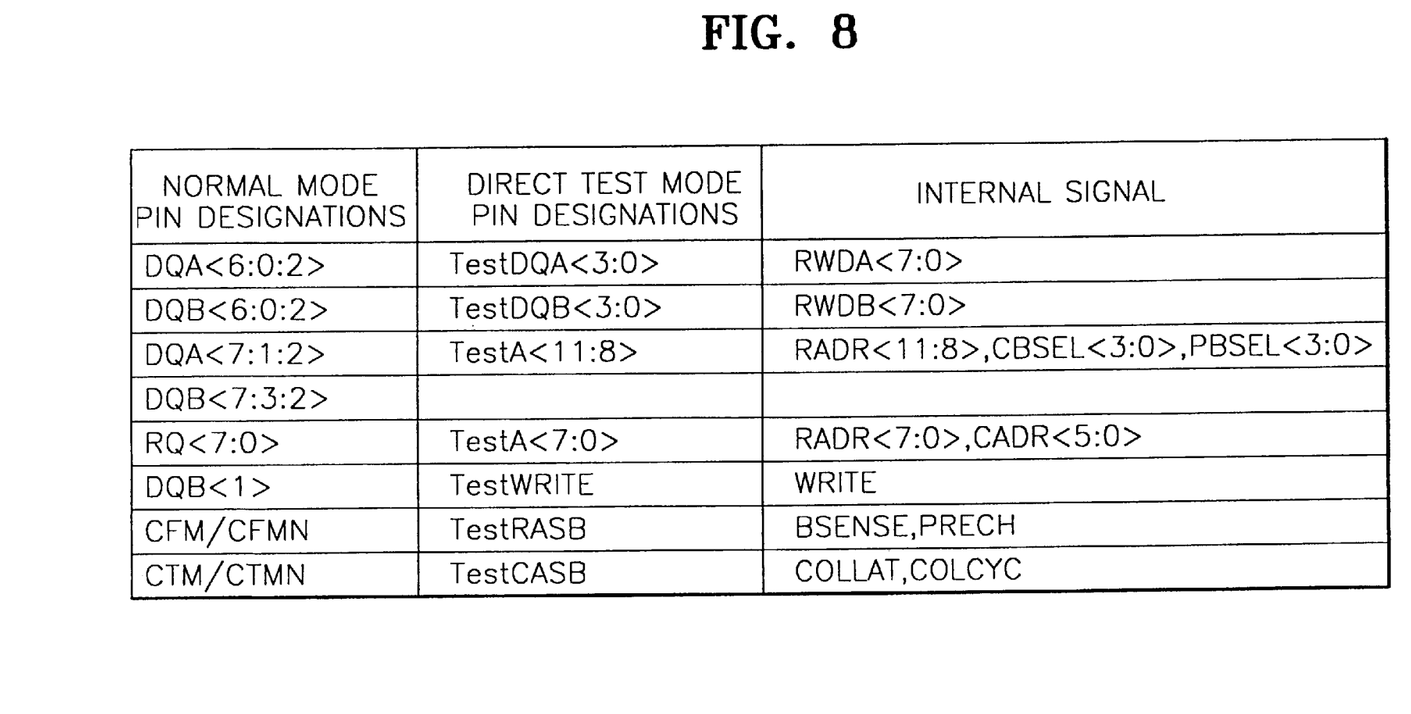
FIG. 8 is a table that illustrates a second embodiment of pin assignments and methods for a packet integrated circuit memory device in direct test mode according to the present invention.

FIG. 8 is a table that illustrates a second embodiment of pin assignments and methods for a packet type integrated circuit memory device in direct test mode according to the present invention. According to FIG. 8, a pair of the internal data signals is responsive to each data pin, therefore allowing half length data words to be used in testing the packet type integrated circuit memory device in direct test mode. In particular, the TestDQA <3:0> pins and the TestDQB <3:0> pins are each responsive to two internal data signals. For example, TestDQA <0> is used to provide the internal signals RWDA <0> and <1> for write operations in the direct test mode. Similarly, RWDA <0> and <1> retrieved from the memory array by a read operation in direct test mode and a comparison then is provided to TestDQA <0>.

The data pins DQA <6:0:2> in normal mode are designated as the TestDQA <3:0> pins in the direct test mode to provide the internal data signals RWDA <7:0>. The designation DQA <6:0:2> represents the even pin numbers in the range from <0> to <6> or <0,2,4,6>. In particular, TestDQA <3> provides RWDA <6> and <7>. TestDQA <2> provides RWDA <4> and <5>. TestDQA <1> provides RWDA <2> and <3> and TestDQA <0> provides RWDA <0> and <1>.

Similarly, the data pins DQB <6:0:2> in normal mode are designated as the TestDQB <3:0> in the direct test mode to provide the internal data signals RWDB <7:0>. In particular, TestDQB <3> provides RWDB <6> and <7>. TestDQB <2> provides RWDB <4> and <5>. TestDQB <1> provides RWDB <2> and <3> and TestDQB <0> provides RWDB <0> and <1>. The data pins DQA <7:1:2> in normal mode are designated as TestA<11:8> in direct test mode to provide the row address RADR<11:8>, the column bank select CSEL <3:0>, and the precharge bank select PBSEL<3:0> respectively at the proper times.

The request pins RQ<7:0> in normal mode are designated as TestA<7:0> in direct test mode to provide row address bits RADR<7:0> and column address bits CADR<5:0> at the respective times in direct test mode. The CFM and CFMN pins in normal mode are designated as TestRASB in direct test mode to provide internal control signals BSENSE and PRECH to the memory array at the proper time. The CTM and CTMN pins in normal mode are designated as the TestCASB pin in the direct test mode to provide the internal control signals COLLAT and COLCYC in the direct test mode at the proper times. The DQB <1> pin in normal mode is designated as the TestWrite internal signal to provide the WRITE signal in the direct test mode.

Figure 9:
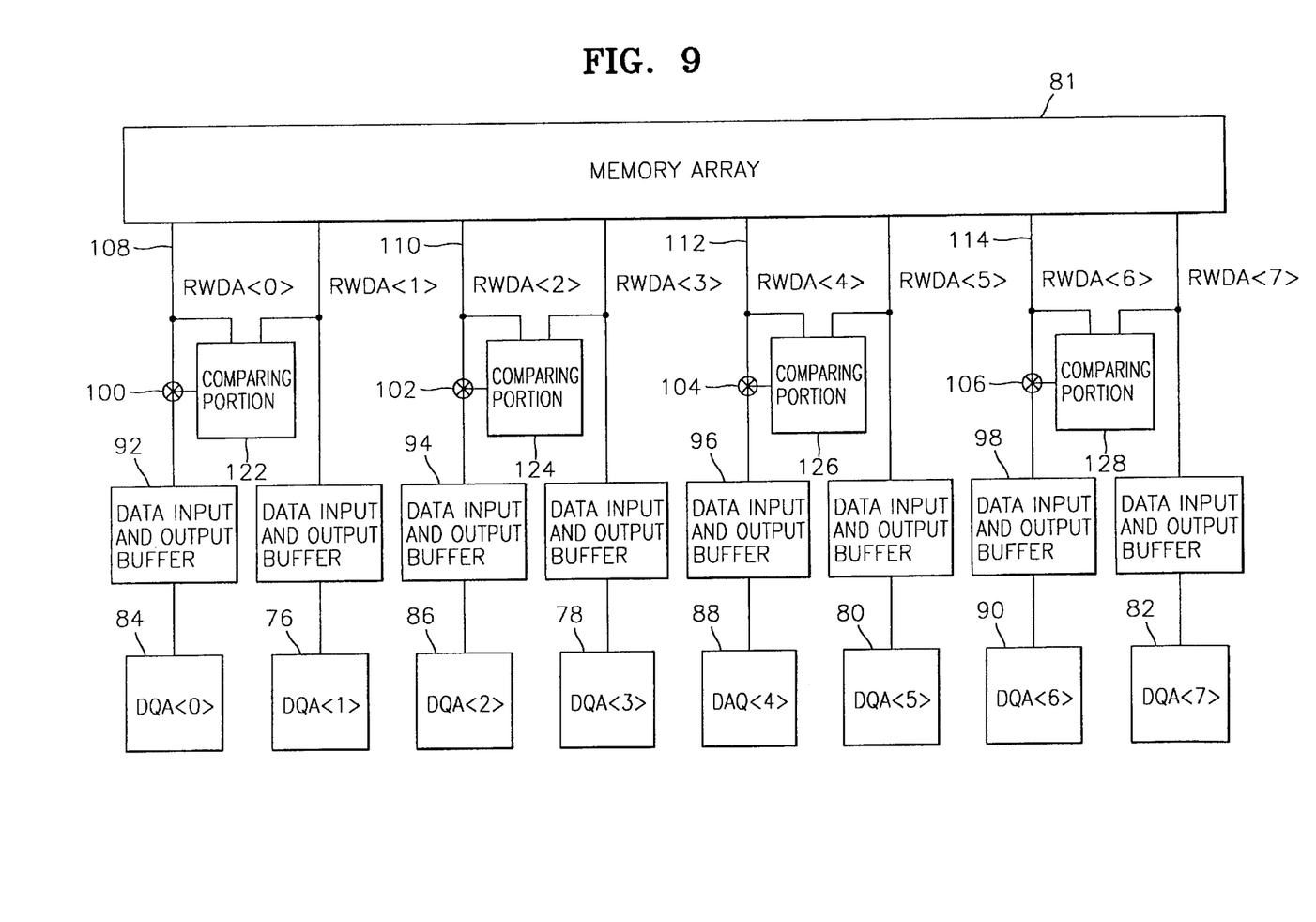
FIG. 9 is a circuit diagram that provides data to the memory array for write operations in direct test mode and that provides data read from the memory array in direct test mode according to the pin assignments of FIG. 8.

FIG. 9 is a circuit diagram that provides data to the memory array for write operation in direct test mode and that provides data read from the memory array in direct test mode according to the pin assignments of FIG. 8. According to FIG. 9, data pins DQA <7:0> provide data for a write operation in direct test mode and provide read data in a read operation in direct test mode. More particularly, pins DQA <0> 84, DQA <2> 86, DQA <4> 88, and DQA <6> 90 provide a data word to be written to the memory array 81 in direct test mode. For example, a four bit data word applied to pins DQA <0> 84, DQA <2> 86, DQA <4> 88, and DQA <6> 90 is duplicated to provide an eight bit data word to be stored in the memory array 81. In a read operation in direct test mode, an eight bit data word is retrieved from the memory array and reduced to provide the read data via pins DQA <0> 84, DQA <2> 86, DQA <4> 88, and DQA <6> 90. During normal operations, pins DQA <1> 76, DQA <3> 78, DQA <5> 80, and DQA <7> 82 provide the remaining portion of the eight bit data word stored in and read from the memory array 81. In other words, in normal write operations, pins DQA <7:0> provide the eight bit data words to be written and read from the memory array 81.

Referring again to direct test mode operations, data input and output buffers 92, 94, 96, and 98 are responsive to the corresponding DQA pins to provide buffered write data to the corresponding switches 100, 102, 104, and 106 respectively for write operations. Data input and output buffers 92, 94, 96, and 98 also provide buffered read data based on switched read data from the switches 100, 102, 104, and 106.

The switches 100, 102, 104, and 106 received buffered write data from the corresponding data input and output buffer 92, 94, 96, and 98. The switches transfer the buffered write data from data buses 108, 110, 112, and 114 respectively to the comparing portions 122, 124, 126, and 128 respectively in direct test mode. The switches 100, 102, 104, and 106 also receive compared read data from the respective comparing portions 122, 124, 126, and 128. The switches transfer buffered write data and compared read data off/onto the data bus during direct test mode operations.

The comparators 122, 124, 126, and 128 duplicate switched write data received from the respective switches 100, 102, 104, and 106 to provide pairs of data bits as write data to the memory array 81 via data buses 108, 110, 112, and 114 respectively. In particular, a data bit is duplicated to determine the data bit pair, for example, the data bit received on pin DQA<0> is duplicated to determine RWDA<0> and RWDA<1>.

The comparators 122, 124, 126, and 128 also compare data bit pairs retrieved from the memory array to determine the operational integrity of the memory array 81. For example, the comparator 122 compares the data bits of the pair defined by RWDA <0> and RWDA <1> retrieved from the memory array 81. If the data bit pair is equal, the comparator generates a logic level indicating no error. However, if the data bit pair is not equal, the comparator generates a logic level indicating an error.

Referring to FIG. 9, the data signal lines 10 are used independently and are not used as address or control signals. In a packet type IC memory, according to the present invention, the DQ 15 pins are assigned to data, address or control signals and the RQ 25 pins are assigned to address or control signals, as shown in FIGS. 4 and 7.

According to the present invention the internal data and address signals are provided to the memory array in the packet type integrated circuit memory device through separate pins, thereby allowing a reduction in testing time and allowing conventional testers to test integrated circuit memory devices embodying the present invention. In contrast, conventional integrated circuit memory devices may use some of the same pins to provide data and address to the memory array. Multiplexing the address and data may increase the timing of the read and write operations that test the packet type integrated circuit memory devices.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A packet type integrated circuit memory device having a plurality of pins and a memory array, wherein the packet type integrated circuit memory device operates in a direct test mode, wherein data is stored in and retrieved from the memory array in response to direct test mode packets that include data, address and control information applied to the pins of the packet type integrated circuit memory device in the direct test mode, the packet type integrated circuit memory device comprising:

a plurality of first pins, selected from the plurality of pins on the packet type integrated circuit memory device, assigned to a plurality of internal data signals in the packet type integrated circuit memory device that provide the data information from the direct test mode packet to the memory array in direct test mode; and a plurality of second pins, selected from the plurality of pins on the packet type integrated circuit memory device, assigned to a plurality of internal address signals in the packet type integrated circuit memory device that provide the address information from the direct test mode packet to the memory array in direct test mode, wherein none of the pins included in plurality of first pins are included in the plurality second of pins.

2. The packet type integrated circuit memory device of claim 1, further comprising a plurality of third pins, selected from the plurality of pins on the packet type integrated circuit memory device, assigned to a plurality of internal control signals in the packet type integrated circuit memory device that provide the control information from the direct test mode packet to the memory array, wherein the control information includes clock signals for synchronous operation of the packet type integrated circuit memory device in direct test mode.

3. The packet type integrated circuit memory device of claim 1, wherein $2^n$ internal data signals are assigned to a corresponding pin selected from the plurality of first pins on the packet type integrated circuit memory device wherein n is an integer.

4. The packet type integrated circuit memory device of claim 1, wherein the plurality of second pins comprises:

a plurality of fourth pins, selected from the plurality of second pins, assigned to a plurality of first internal address signals to provide a first portion of an address to the memory array; and a plurality of fifth pins, selected from the plurality of second pins, assigned to a plurality of second internal address signals to provide a second portion of the address to the memory array.

5. The packet type integrated circuit memory device of claim 2, wherein the internal control signals include a row address strobe signal, a column address strobe signal, and a data write signal.

6. A packet type integrated circuit memory device that stores data in response to a direct test mode write operation and that retrieves read data in response to a direct test mode read operation in a direct test mode, the packet type integrated circuit memory device comprising:

a plurality of pins on the packet type integrated circuit memory device that receive the data from the direct test mode write operation to provide received write data in response to the direct test mode write operation;

a plurality of buffers, wherein each of the plurality of buffers is responsive to a corresponding one of the plurality of pins, that transmit the received write data to provide buffered write data in response to the direct test mode write operation;

a plurality of switches, wherein each of the plurality of switches is responsive to a corresponding one of the plurality of buffers, that transfer the buffered write data to provide switched write data in response to the direct test mode write operation;

a plurality of comparators, wherein each of the comparators is responsive to a corresponding one of the plurality of switches, that duplicate the switched write data to provide a duplicated data bit pair including two data bits in response to the direct test mode write operation;

a memory array, responsive to the plurality of comparators, that stores the duplicated data bit pair in response to the direct test mode write operation;

wherein the memory array retrieves the stored duplicated data bit pair to provide a retrieved duplicated data bit pair to the plurality of comparators in response to the direct test mode read operation;

wherein the plurality of comparators are responsive to the memory array and provide compared read data to the plurality of switches based on a difference in the two data bits in the retrieved duplicated data bit pair in response to the direct test mode read operation;

wherein the plurality of switches are each responsive to a corresponding one of the plurality of comparators and transfer the compared read data to the plurality of data buffers in response to the direct test mode read operation;

wherein the plurality of buffers are each responsive to a corresponding one of the plurality of switches and transmit buffered read data to the plurality of pins based on the transferred compared read data in response to the direct test mode read operation; and wherein the plurality of pins are each responsive to a corresponding one of the plurality of data buffers and provide read data based on the buffered read data in response to the direct test mode read operation.

7. The packet type integrated circuit memory device of claim 6, wherein the packet type integrated circuit memory device stores data in the memory array in response to a normal write operation and that retrieves data from the memory array in response to a normal read operation, the packet type integrated circuit memory device further comprising:

a plurality of second pins on the packet type integrated circuit memory device that receive the data from the normal write operation to provide received write data in response to the normal write operation;

a plurality of second buffers, wherein each of the plurality of second buffers is responsive to a corresponding one of the plurality of second pins, that transmit the received data to provide buffered write data to the memory array in response to the normal mode write operation; and wherein the plurality of second buffers are each responsive to the memory array and provide buffered read data to the plurality of second pins based on the data read from the memory array in response to the normal mode read operation.

8. The packet type integrated circuit memory device of claim 6, wherein the compared read data provided to the corresponding one of the plurality of switches in response to the direct test mode read operation comprises a logic level that indicates that the two data bits read from the memory array are equal.

9. The packet type integrated circuit memory device of claim 6, wherein each comparator comprises an exclusive or gate.

10. A method of assigning pins on a packet type integrated circuit memory device to internal signals of the packet type integrated circuit memory device, wherein the packet type integrated circuit memory device operates in a direct test mode, wherein data is stored in and retrieved from a memory array in the packet type integrated circuit memory device in response to direct test mode packets including data, address and control information applied to the pins of the packet type integrated circuit memory device in the direct test mode, the method comprising:

assigning a plurality of first pins, selected from the plurality of pins on the packet type integrated circuit memory device, to a plurality of internal data signals to provide the data information from the direct test mode packet to the memory array in direct test mode; and assigning a plurality of second pins, selected from the plurality of pins on the packet type integrated circuit memory device, to a plurality of internal address signals to provide the address information from the direct test mode packet to the memory array in direct test mode, wherein none of the pins included in plurality of first pins are included in the plurality of second pins.

11. The method of claim 10 further comprising assigning a plurality of third pins, selected from the plurality of pins on the packet type integrated circuit memory device, to a plurality of internal control signals to provide the control information from the direct test mode packet to the memory array,wherein the control information includes a clock signal that provides for the synchronous operation of the packet type integrated circuit memory device in the direct test mode.

12. The method of claim 10, wherein the step of assigning a plurality of first pins comprises assigning a plurality of first pins, selected from the plurality of pins on the packet type integrated circuit memory device, to a plurality of internal data signals to provide the data information in the direct test mode packet to the memory array in direct test mode, wherein $2^n$ internal data signals are assigned to a corresponding pin selected from the plurality of first pins wherein n is an integer.

13. The method of claim 10, wherein the step of assigning a plurality of second pins comprises:

assigning a plurality of fourth pins, selected from the plurality of second pins, to a plurality of first internal address signals to provide a first portion of an address to the memory array; and assigning a plurality of fifth pins, selected from the plurality of second pins, to a plurality of second internal address signals to provide a second portion of the address to the memory array.

14. The method of claim 11, wherein the step of assigning a plurality of third pins comprises assigning a plurality of third pins, selected from the plurality of pins on the packet type integrated circuit memory device, to a plurality of internal control signals to provide the control information from the direct test mode packet to the memory array, wherein the internal control signals include a row address strobe signal, a column address strobe signal, and a data write signal.

15. A packet type integrated circuit memory device having a plurality of pins, a logic block and a memory array, wherein the packet type integrated circuit memory device operates in a direct test mode, wherein data is stored in and retrieved from the memory array in response to the data, address and control information generated by the logic block and applied to the memory array in the direct test mode, the packet type integrated circuit memory device comprising:

a plurality of first pins, selected from the plurality of pins on the packet type integrated circuit memory device, assigned to a plurality of internal data signals in the packet type integrated circuit memory device that provide the data information from the direct test mode packet to the memory array in direct test mode; and a plurality of second pins, selected from the plurality of pins on the packet type integrated circuit memory device, assigned to a plurality of internal address signals in the packet type integrated circuit memory device that provide the address information from the direct test mode packet to the memory array in direct test mode, wherein none of the pins included in plurality of first pins are included in the plurality second of pins.

* * * * *

UNITED STATES PATENT AND TRADEMARK OFFICE
CERTIFICATE OF CORRECTION

PATENT NO. : 6,078,536
DATED : June 20, 2000
INVENTOR(S) : Moon et al.

It is certified that error appears in the above-identified patent and that said Letters Patent is hereby corrected as shown below:

Title page, item [54] and Col. 1   After "ASSIGNED" please add -- FOR --.

Signed and Sealed this

First Day of May, 2001

Attest:

NICHOLAS P. GODICI

Attesting Officer     Acting Director of the United States Patent and Trademark Office